US012622245B2

(12) United States Patent
Chen et al.

(10) Patent No.: US 12,622,245 B2
(45) Date of Patent: May 5, 2026

(54) ION IMPLANT PROCESS FOR DEFECT ELIMINATION IN METAL LAYER PLANARIZATION

(71) Applicant: TAIWAN SEMICONDUCTOR MANUFACTURING CO., LTD., Hsinchu (TW)

(72) Inventors: Chia-Cheng Chen, Hsinchu (TW); Huicheng Chang, Tainan (TW); Fu-Ming Huang, Shengang Township (TW); Kei-Wei Chen, Tainan (TW); Liang-Yin Chen, Hsinchu (TW); Tang-Kuei Chang, Tainan (TW); Yee-Chia Yeo, Hsinchu (TW); Wei-Wei Liang, Hsinchu (TW); Ji Cui, Bolingbrook, IL (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 17/815,407

(22) Filed: Jul. 27, 2022

(65) Prior Publication Data

US 2022/0359277 A1     Nov. 10, 2022

Related U.S. Application Data

(63) Continuation of application No. 16/997,616, filed on Aug. 19, 2020, now Pat. No. 11,450,565.

(Continued)

(51) Int. Cl.
*H01L 21/768*      (2006.01)
*H01L 21/321*      (2006.01)
(Continued)

(52) U.S. Cl.
CPC .... *H01L 21/76859* (2013.01); *H01L 21/3212* (2013.01); *H01L 21/76802* (2013.01);
(Continued)

(58) Field of Classification Search
CPC ........... H01L 21/76859; H01L 21/3212; H01L 21/76802; H01L 21/76805; H01L 21/7684;
(Continued)

(56) References Cited

U.S. PATENT DOCUMENTS

| | | |
|---|---|---|
| 11,450,565 B2 | 9/2022 | Chen et al. |
| 2002/0115292 A1* | 8/2002 | Andricacos ....... H01L 23/53233 257/E21.585 |

(Continued)

FOREIGN PATENT DOCUMENTS

| | | |
|---|---|---|
| CN | 1674251 A | 9/2005 |
| CN | 102832199 A | 12/2012 |

(Continued)

OTHER PUBLICATIONS

Written Opinion on Patentability directed to related Korean Patent Application No. 20200165037, mailed Sep. 30, 2022 (with attached English-language translation); 11 pages.

*Primary Examiner* — Farun Lu
(74) *Attorney, Agent, or Firm* — Sterne, Kessler, Goldstein & Fox P.L.L.C.

(57) ABSTRACT

The present disclosure describes a method for the planarization of ruthenium metal layers in conductive structures. The method includes forming a first conductive structure on a second conductive structure, where forming the first conductive structure includes forming openings in a dielectric layer disposed on the second conductive structure and depositing a ruthenium metal in the openings to overfill the openings. The formation of the first conductive structure (Continued)

includes doping the ruthenium metal and polishing the doped ruthenium metal to form the first conductive structure.

20 Claims, 15 Drawing Sheets

Related U.S. Application Data

(60) Provisional application No. 63/002,291, filed on Mar. 30, 2020.

(51) Int. Cl.

| | |
|---|---|
| *H01L 23/522* | (2006.01) |
| *H01L 23/532* | (2006.01) |
| *H01L 23/535* | (2006.01) |
| *H01L 29/08* | (2006.01) |
| *H01L 29/45* | (2006.01) |
| *H01L 29/78* | (2006.01) |
| *H10D 30/62* | (2025.01) |
| *H10D 62/13* | (2025.01) |
| *H10D 64/62* | (2025.01) |

(52) U.S. Cl.
CPC .... *H01L 21/76805* (2013.01); *H01L 21/7684* (2013.01); *H01L 21/76843* (2013.01); *H01L 21/76877* (2013.01); *H01L 21/76895* (2013.01); *H01L 23/5226* (2013.01); *H01L 23/53238* (2013.01); *H01L 23/535* (2013.01); *H10D 30/6211* (2025.01); *H10D 62/151* (2025.01); *H10D 64/62* (2025.01)

(58) Field of Classification Search
CPC ......... H01L 21/76843; H01L 21/76877; H01L 21/76895; H01L 23/5226; H01L 23/53238; H01L 23/535; H01L 29/0847; H01L 29/45; H01L 29/7851; H01L 21/76883; H01L 23/53242; H01L 21/76871; H01L 23/528; H01L 23/53209; H01L 2221/1068; H01L 2221/1084
See application file for complete search history.

(56) References Cited

U.S. PATENT DOCUMENTS

| | | | |
|---|---|---|---|
| 2003/0118798 A1 | 6/2003 | Fujii | |
| 2005/0153544 A1 | 7/2005 | Suh et al. | |
| 2006/0286797 A1 | 12/2006 | Zhang et al. | |
| 2007/0059502 A1 | 3/2007 | Wang et al. | |
| 2007/0085211 A1* | 4/2007 | Hamada | H01L 21/76807 |
| | | | 257/E23.145 |
| 2007/0155165 A1* | 7/2007 | Park | H01L 23/53295 |
| | | | 257/E21.585 |
| 2007/0232062 A1* | 10/2007 | Nogami | H01L 21/76835 |
| | | | 438/638 |
| 2008/0042281 A1 | 2/2008 | Abe | |
| 2009/0098726 A1 | 4/2009 | Aoi | |
| 2009/0321935 A1* | 12/2009 | O'Brien | H01L 21/76843 |
| | | | 438/643 |
| 2010/0029071 A1* | 2/2010 | Russell | H01L 21/76859 |
| | | | 438/514 |
| 2010/0029078 A1* | 2/2010 | Russell | H01L 23/53238 |
| | | | 438/674 |
| 2010/0197135 A1* | 8/2010 | Ishizaka | H01L 21/28562 |
| | | | 438/653 |
| 2011/0057316 A1* | 3/2011 | Kim | H01L 21/76831 |
| | | | 438/653 |
| 2013/0069234 A1 | 3/2013 | Lee et al. | |
| 2014/0084472 A1 | 3/2014 | Sun et al. | |
| 2014/0291847 A1 | 10/2014 | Zhang et al. | |
| 2015/0129961 A1* | 5/2015 | Li | H10D 89/10 |
| | | | 438/587 |
| 2015/0325484 A1 | 11/2015 | Lin et al. | |
| 2018/0040507 A1 | 2/2018 | Adusumilli et al. | |
| 2018/0151387 A1* | 5/2018 | Liu | H10D 30/6212 |
| 2018/0374747 A1* | 12/2018 | Joi | C25D 3/58 |
| 2019/0067131 A1* | 2/2019 | Liaw | H10D 84/038 |
| 2019/0157148 A1 | 5/2019 | Hsieh et al. | |
| 2019/0371659 A1* | 12/2019 | Dordi | H01L 21/76861 |
| 2020/0063256 A1 | 2/2020 | Venkatraman et al. | |
| 2020/0090983 A1 | 3/2020 | Lee et al. | |
| 2020/0411369 A1* | 12/2020 | Yang | H01L 21/0337 |
| 2022/0359277 A1 | 11/2022 | Chen et al. | |

FOREIGN PATENT DOCUMENTS

| | | |
|---|---|---|
| CN | 105097471 A | 11/2015 |
| CN | 109904133 A | 6/2019 |
| KR | 20000047634 A | 7/2000 |

* cited by examiner

200

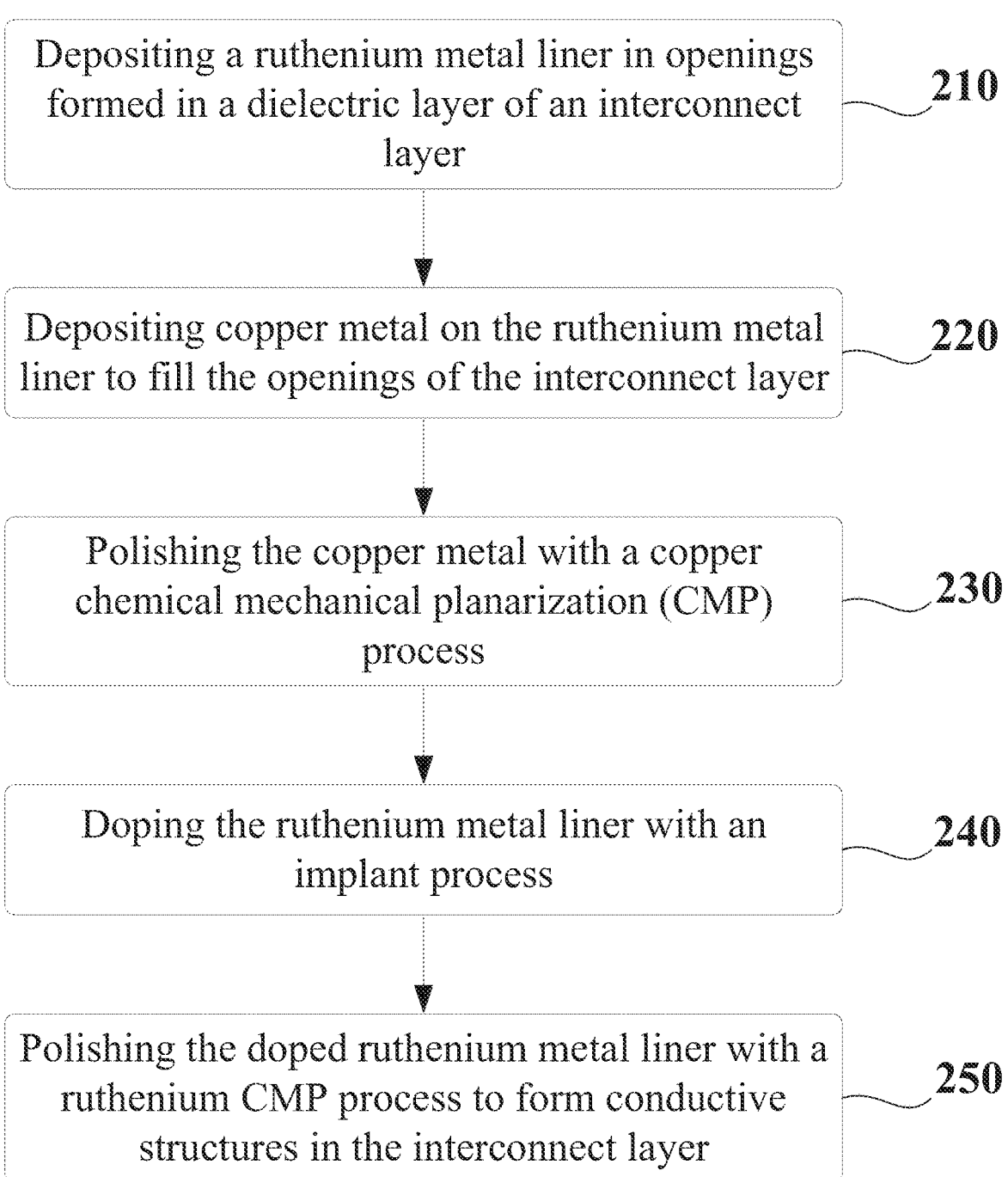

Depositing a ruthenium metal liner in openings formed in a dielectric layer of an interconnect layer ⟶ 210

Depositing copper metal on the ruthenium metal liner to fill the openings of the interconnect layer ⟶ 220

Polishing the copper metal with a copper chemical mechanical planarization (CMP) process ⟶ 230

Doping the ruthenium metal liner with an implant process ⟶ 240

Polishing the doped ruthenium metal liner with a ruthenium CMP process to form conductive structures in the interconnect layer ⟶ 250

Depositing ruthenium metal in contact openings formed in a dielectric layer — 1010

Doping the ruthenium metal with an implant process — 1020

Polishing the doped ruthenium metal with a ruthenium CMP process to form conductive structures — 1030

ION IMPLANT PROCESS FOR DEFECT ELIMINATION IN METAL LAYER PLANARIZATION

CROSS-REFERENCE TO RELATED APPLICATION

This application is a continuation of U.S. Non-Provisional patent application Ser. No. 16/997,616, filed on Aug. 19, 2020, titled "Ion implant Process for Defect Elimination in Metal Layer Planarization," which claims the benefit of U.S. Provisional Patent Application No. 63/002,291, filed on Mar. 30, 2020 and titled "Ion Implant Process for Defect Elimination in Metal Layer Planarization." The aforementioned applications are incorporated herein by reference in their entireties.

BACKGROUND

Chemical mechanical polishing or planarization (CMP) is a process for smoothing and planarizing surfaces with a combination of chemical and mechanical forces. CMP uses an abrasive chemical slurry in conjunction with a polishing pad and a retaining ring. In semiconductor fabrication, CMP is used to planarize and polish different types of materials (e.g., dielectrics, metals, and semiconductors) having a crystalline, polycrystalline, or amorphous microstructures.

BRIEF DESCRIPTION OF THE DRAWINGS

Aspects of the present disclosure are best understood from the following detailed description when read with the accompanying figures.

FIG. 2 is a flowchart of a method describing various operations for the formation of conductive structures in an interconnect layer, in accordance with some embodiments.

DETAILED DESCRIPTION

Figure 1:
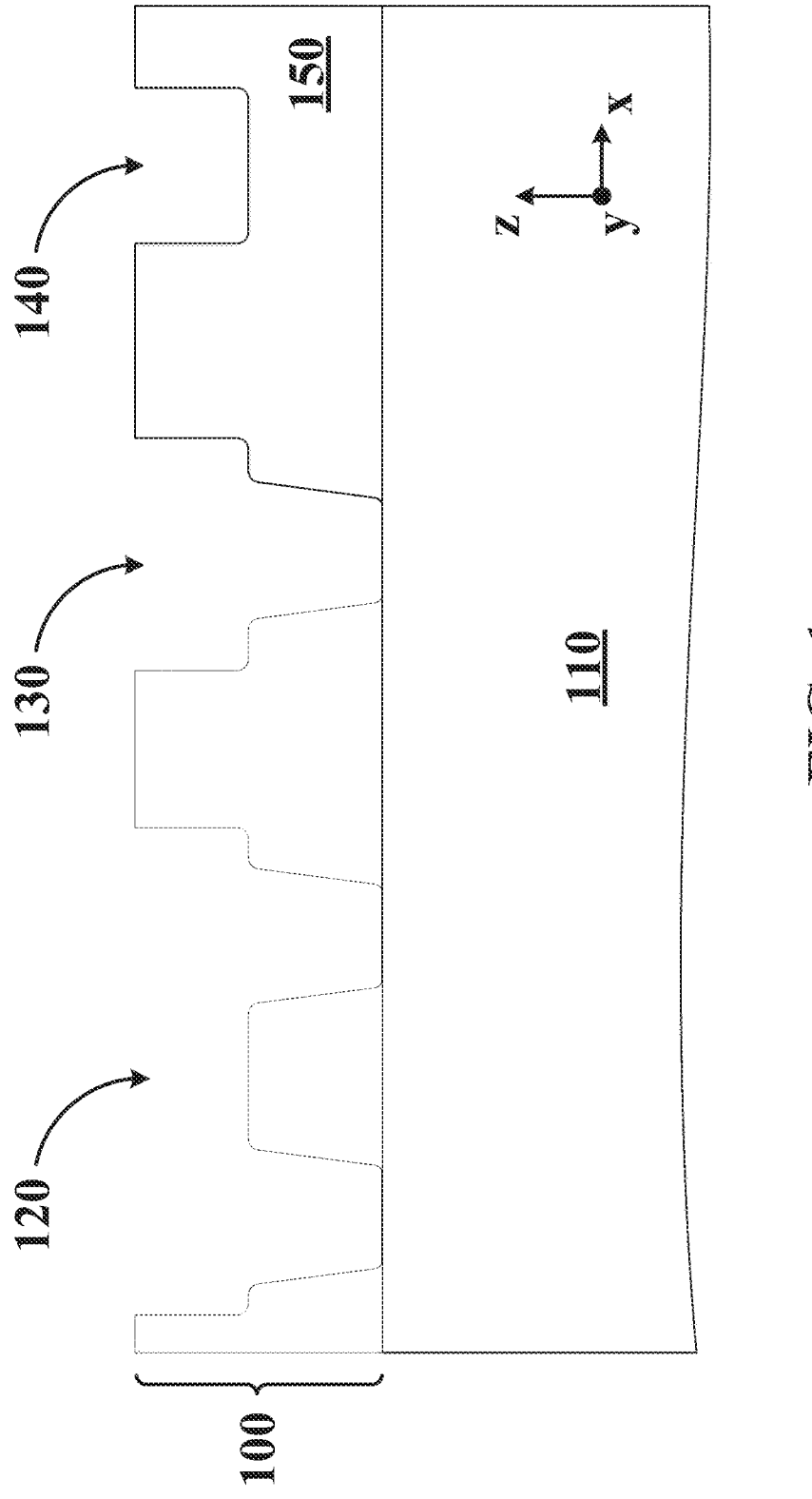
FIG. 1 is a cross-sectional view of metallization layer openings, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., $\pm 1\%$, $\pm 2\%$, $\pm 3\%$, $\pm 4\%$, $\pm 5\%$ of the value). These values are merely examples and are not intended to be limiting. It is to be understood that the terms "about" and "substantially" can refer to a percentage of the values as interpreted by those skilled in relevant art(s) in light of the teachings herein.

Ruthenium metal can be used as a fill material for conductive structures in a middle-end-of-line (MEOL) process and a diffusion barrier/seed layer for copper interconnects in a back-end-of-line (BEOL) process. This is because ruthenium metal exhibits low bulk resistivity (e.g., about 7.7 $\mu\Omega\cdot$cm) and sufficient corrosion resistance to copper plating chemistries.

Integration of ruthenium in semiconductor manufacturing has its challenges. For example, ruthenium, which is resistant to chemical attack, is difficult to planarize (e.g., exhibits a low polishing rate) with existing chemical mechanical polishing (CMP) slurries like the ones used for other metals in semiconductor manufacturing like copper, aluminum, tungsten, cobalt, etc. Therefore, other CMP slurries are developed for ruthenium planarization processes. These other CMP slurries require strong oxidizers—such as ceric ammonium nitrate $((NH_4)_2Ce(NO_3)_6)$, sodium periodate $(NaIO_4)$, potassium periodate $(KIO_4)$, potassium permanganate $(KMnO_4)$—and long polishing times to remove ruthenium metal layers. Long polishing times with strong oxidizers can damage surrounding materials. For example, strong oxidizers can cause copper galvanic corrosion—e.g., an electrochemical process in which one metal (e.g., copper) corrodes preferentially when it is in electrical contact with another metal (e.g., ruthenium) in the presence of an electrolyte (e.g., the CMP slurry). In addition, the pH of the slurry employed in ruthenium polishing needs to be controlled between about 8.4 and about 10 to prevent the formation of ruthenium tetroxide $(RuO_4)$, which is a toxic byproduct of the chemical reaction between the ruthenium metal and the CMP slurry.

To address the aforementioned shortcomings, the embodiments described herein are directed to an ion implant method configured to increase the polishing rate of ruthenium metal for CMP slurries like the ones mentioned above and to reduce or minimize the ruthenium polishing time. Reduced ruthenium polishing times are beneficial for the surrounding materials as discussed above. In some embodiments, the implant method includes implants with an implant energy between about 0.3 keV and about 50 keV and an incident angle between 0° and about 80°. In some embodiments, the dopant dose ranges between about $1 \times 10^{14}$ dopants/cm$^2$ and about $1 \times 10^{17}$ dopants/cm$^2$ and includes dopants selected from a group of carbon (C), boron (B), phosphorous (P), oxygen (O), silicon (Si), argon (Ar), germanium (Ge), arsenic (As), xenon (Xe), or other suitable dopants. In some embodiments, after the implant process, the doped ruthenium layers are removed during a subsequent CMP process. According to some embodiments, the polishing rate achieved for a doped ruthenium layer is between about 1.1 and about 1.7 higher than that of an un-doped ruthenium layer. This is because dopants induce defects in the ruthenium metal. The doped ruthenium metal oxidizes faster during the ruthenium CMP process and therefore polishes faster. In some embodiments, implant process parameters that modulate the polishing rate of the ruthenium layer during the CMP process include the dopant species, the dopant dose, the implant energy, and the incident angle at which the dopants impinge the surface of the ruthenium metal.

According to some embodiments, FIG. 1 is a partial cross-sectional view of a partially fabricated interconnect layer 100 formed on a substrate 110. At this fabrication stage, interconnect layer 100 includes openings 120, 130, and 140 formed within a low-k dielectric 150 disposed on substrate 110. In subsequent operations, openings 120, 130, and 140 will be filled with one or more conductive layers, including a ruthenium layer, to form respective conductive structures for interconnect layer 100. In some embodiments, FIG. 1 is a precursor structure (e.g., a starting structure) for the embodiments described herein.

By way of example and not limitation, substrate 110 can be a partially fabricated wafer with one or more layers formed thereon. These one or more layers, which are not shown in FIG. 1 for simplicity, can include, for example, frond-end-line (FEOL) structures (e.g., active devices, passive devices, doped regions, epitaxial structures, etc.) and local or global interconnect layers (e.g., metallization layers, BEOL metallization layers, or combinations thereof). Consequently, interconnect layer 100 can be a first BEOL layer of a stack of BEOL metallization layers or any BEOL within a stack of BEOL metallization layers disposed on substrate 110. When formed, interconnect layer 100 will be electrically coupled to underlying metallization layers (e.g., MEOL and/or BEOL metallization layers) or devices of substrate 110. For example, conductive structures formed in openings 120 and 130 can be in contact with respective conductive structures of underlying metallization layers (e.g., MEOL or BEOL metallization layers) included in substrate 110. The aforementioned layers and features included in substrate 110, which are not shown in FIG. 1, are within the spirit and the scope of this disclosure.

According to some embodiments, openings 120, 130, and 140 are formed by patterning low-k dielectric 150—for example, by using sequential photolithography and etching operations. By way of example and not limitation, openings 120 and 130 may require a double patterning process, while opening 140 may require a single patterning process. In some embodiments, low-k dielectric 150 includes carbon-rich silicon oxide layer with or without pores having a dielectric constant between about 2 and about 3. In some embodiments, low-k dielectric 150 includes a stack of dielectric layers, such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide.

FIG. 2 is a flowchart of a method 200 describing various operations for the formation of conductive structures in an interconnect layer, such as interconnect layer 100 shown in FIG. 1. More specifically, method 200 includes an implant process configured to improve the polishing rate of ruthenium metal layers deposited during the formation of conductive structures in the interconnect layer. Other fabrication operations can be performed between the various operations of method 200 and are omitted merely for clarity and ease of description. These various operations are within the spirit and the scope of this disclosure. Additionally, not all operations may be required to perform the disclosure provided herein. Some of the operations may be performed concurrently, or in a different order than the ones shown in FIG. 2. In some embodiments, one or more other operations may be performed in addition to or in place of the presently described operations. Method 200 will be described in reference to FIGS. 1, 3-8.

Figure 3:
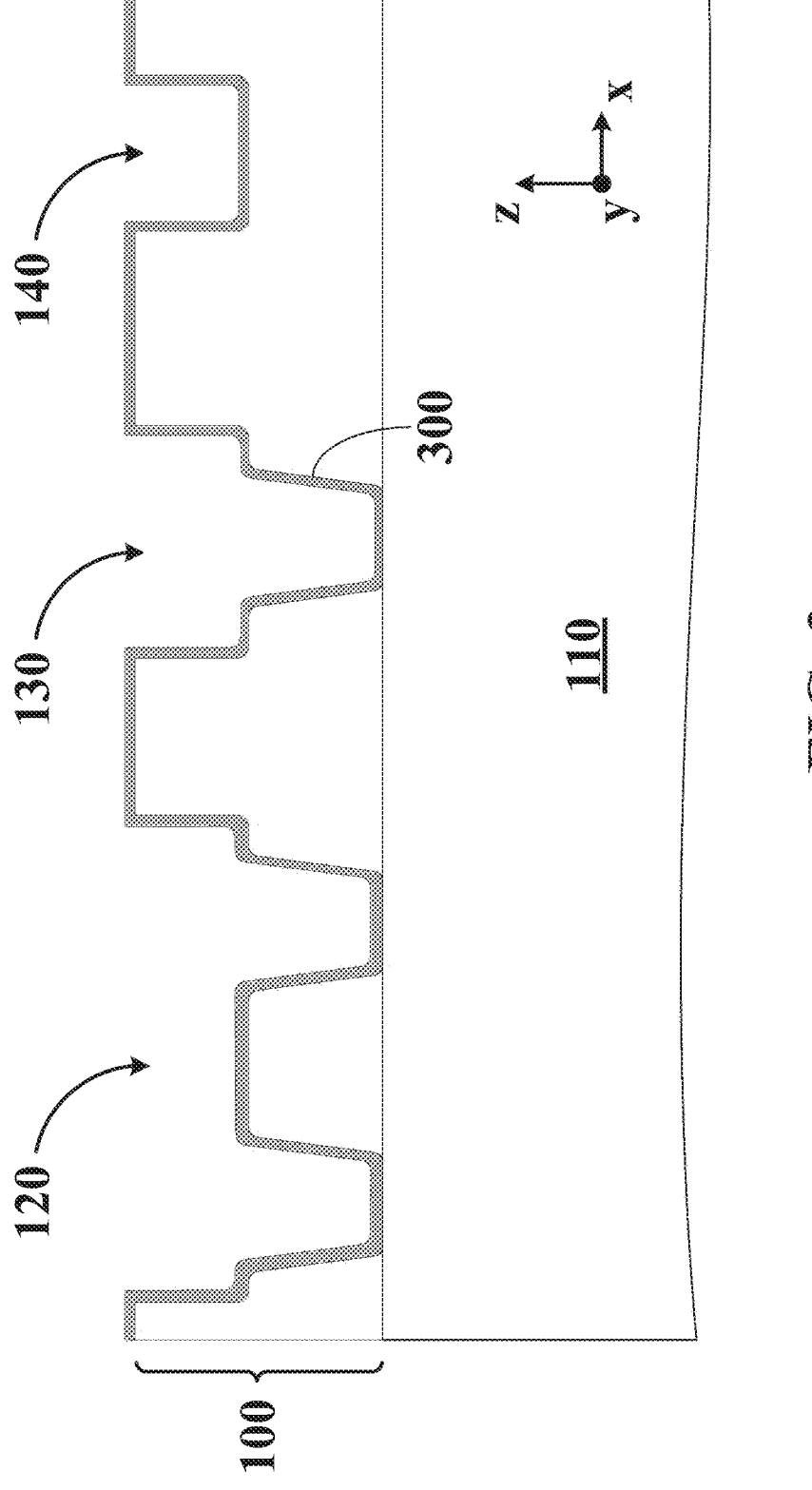
FIGS. 3-8 are cross-sectional views of intermediate structures during the formation of conductive structures in an interconnect layer, in accordance with some embodiments.

In referring to FIG. 2, method 200 begins with operation 210 and the process of depositing a ruthenium metal liner in openings formed in a dielectric layer of an interconnect layer. For example, the openings of operation 210 can correspond to openings 120, 130, and 140 formed in low-k dielectric 150 of interconnect layer 100 shown in FIG. 1. By way of example and not limitation, FIG. 3 shows interconnect layer 100 after operation 210 and the deposition of ruthenium metal liner 300 in openings 120, 130, and 140. In some embodiments, ruthenium metal liner 300 is blanket-deposited on interconnect layer 100 to cover exposed surfaces of low-k dielectric 140 in areas inside and outside of openings 120, 130, and 140 as shown in FIG. 3. In some embodiments, ruthenium metal liner 300 is deposited with a chemical vapor deposition (CVD) process or an atomic layer deposition (ALD) process at a temperature below about 200° C. (e.g., about 180° C.) using a ruthenium carbonyl precursor chemistry, such as triruthenium dodecacarbonyl (Ru$_3$(CO)$_{12}$). In some embodiments, ruthenium metal liner 300 is deposited at an appropriate thickness to serve as a barrier/seed layer for copper metal. For example, the thickness of ruthenium metal liner 300 can range between about 3 Å and about 30 Å.

Figure 4:
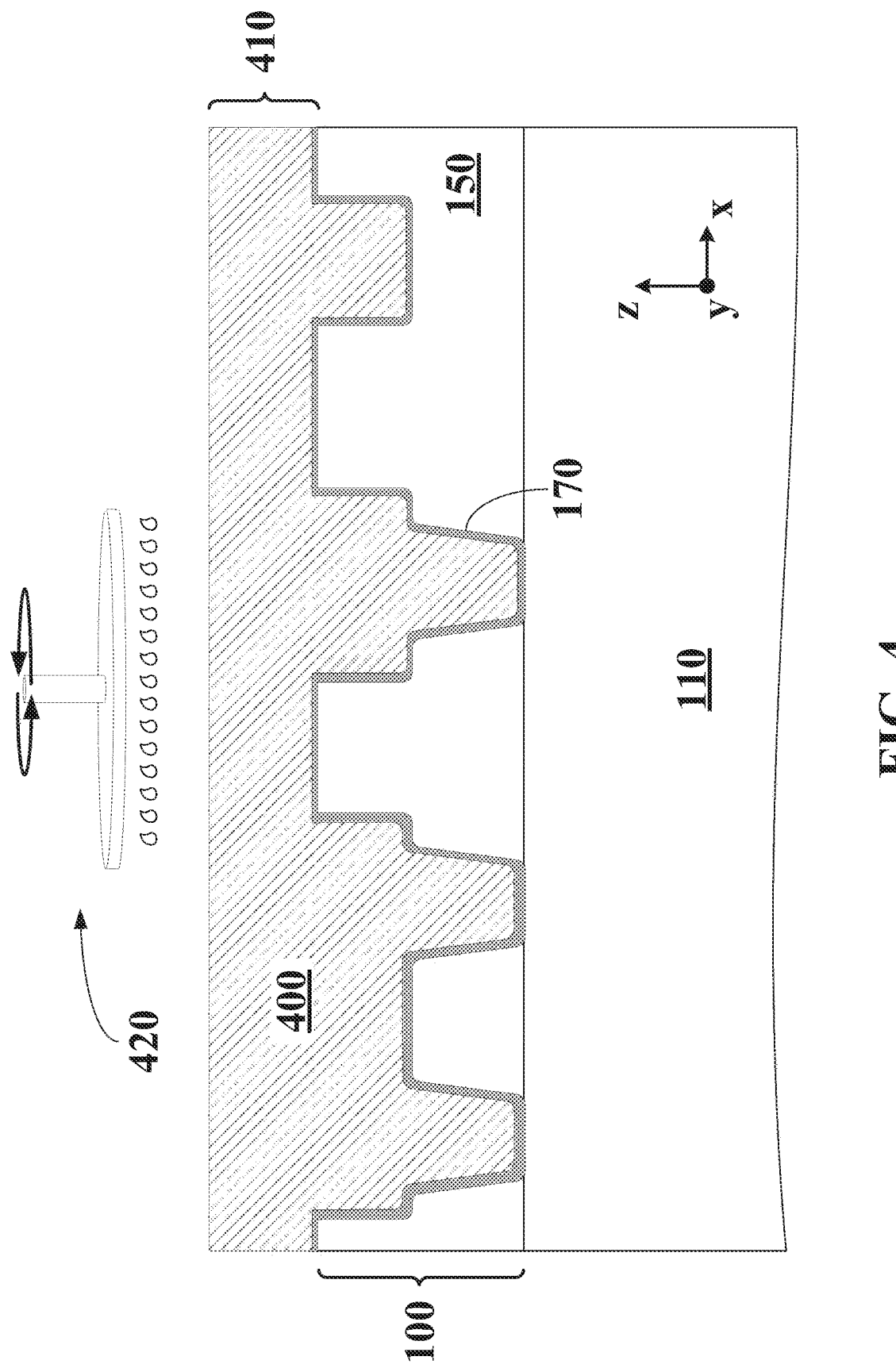
Figure 5:
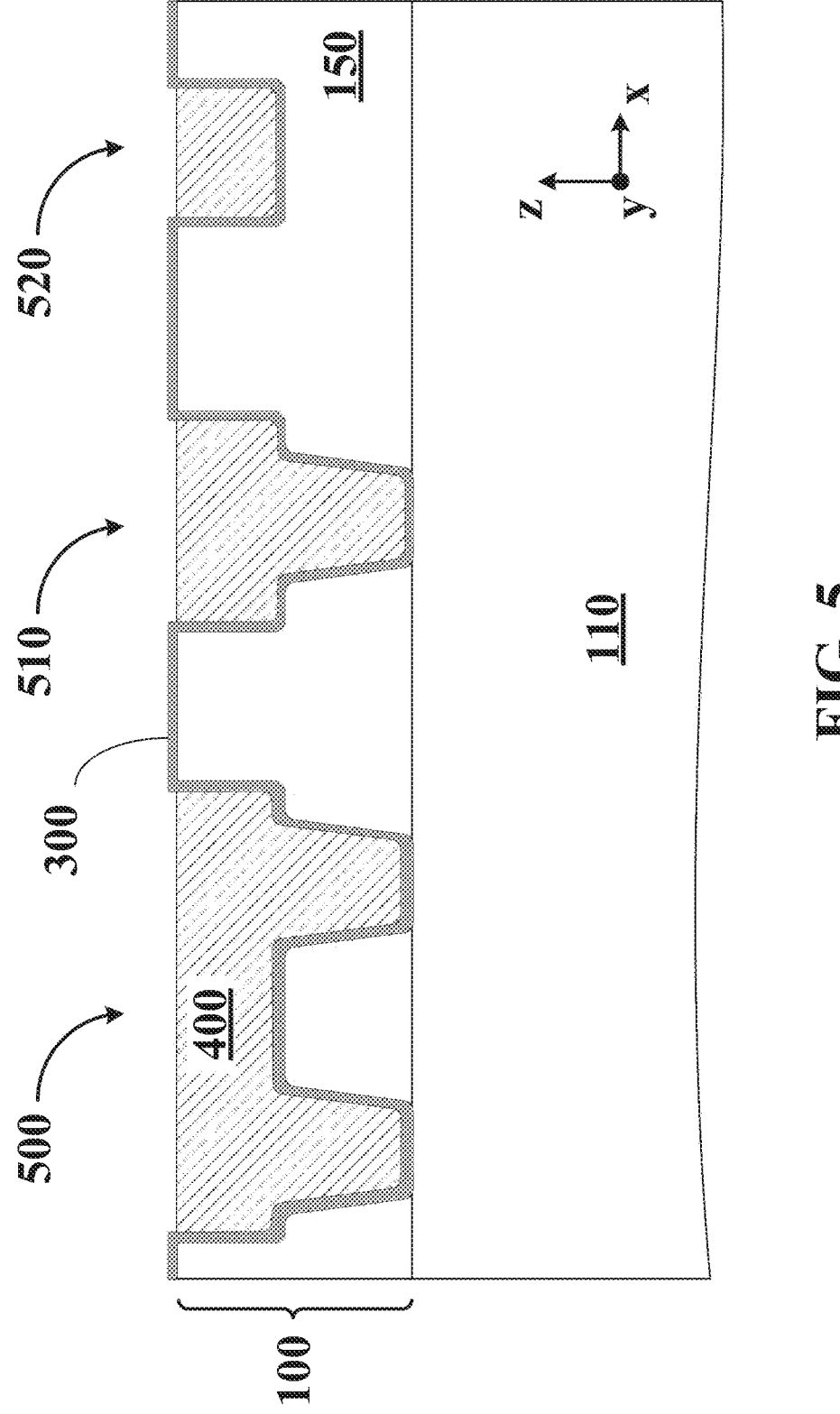

In referring to FIG. 2, method 200 continues with operation 220 and the process of depositing copper metal on the ruthenium metal liner (e.g., ruthenium metal liner 300) to fill the openings (e.g., openings 120, 130, and 140) of the interconnect layer (e.g., interconnect layer 100). In some embodiments, FIG. 4 shows interconnect layer 100 after operation 220 where copper metal 400 is deposited on ruthenium metal liner 300 and substantially fills openings 120, 130, and 140 shown in FIG. 3. In some embodiments, copper metal 400 is grown by a suitable method (e.g., by electroplating) directly on ruthenium metal liner 300. According to some embodiments, copper metal 400 extends over top surfaces of low-k dielectric 150 as shown in FIG. 4 and forms an overburden 410 which will be subsequently removed (e.g., polished down) by a copper CMP process.

In referring to FIG. 2, method 200 continues with operation 230 and the process of polishing copper metal 410 with a copper CMP process. In referring to FIG. 4, copper CMP process 420 removes copper overburden 410 according to operation 230. In some embodiments, copper CMP process 420 is incapable of removing ruthenium metal liner 300 from top surfaces of low-k dielectric 150 for the reasons discussed above. For example, copper CMP process 420 polishes copper metal 400 at a higher rate than ruthenium metal liner 300. Therefore, after copper CMP process 420, ruthenium metal liner 300 appears "raised" with respect to top surfaces of copper metal 400 as shown in the resulting structure of FIG. 5. In some embodiments, if copper CMP process 420 is allowed to continue in an effort to remove ruthenium metal liner 300, copper CMP process 420 will cause excessive copper dishing—e.g., copper CMP process 420 will further recess the top surface of copper metal 400 compared to the surrounding materials (e.g., ruthenium metal layer 300 and low-k dielectric 150).

In referring to FIG. 2, method 200 continues with operation 240 and the process of doping ruthenium metal liner 300 with an implant process. In some embodiments, unlike an un-doped ruthenium metal liner, the doped ruthenium metal liner 300 can be easily oxidized and subsequently removed (e.g., polished) from the top surface of low-k dielectric 150 with a ruthenium CMP process. In some embodiments, the implant process induces defects in the ruthenium metal, which accelerate the ruthenium oxidation rate during the CMP process.

Figure 6:
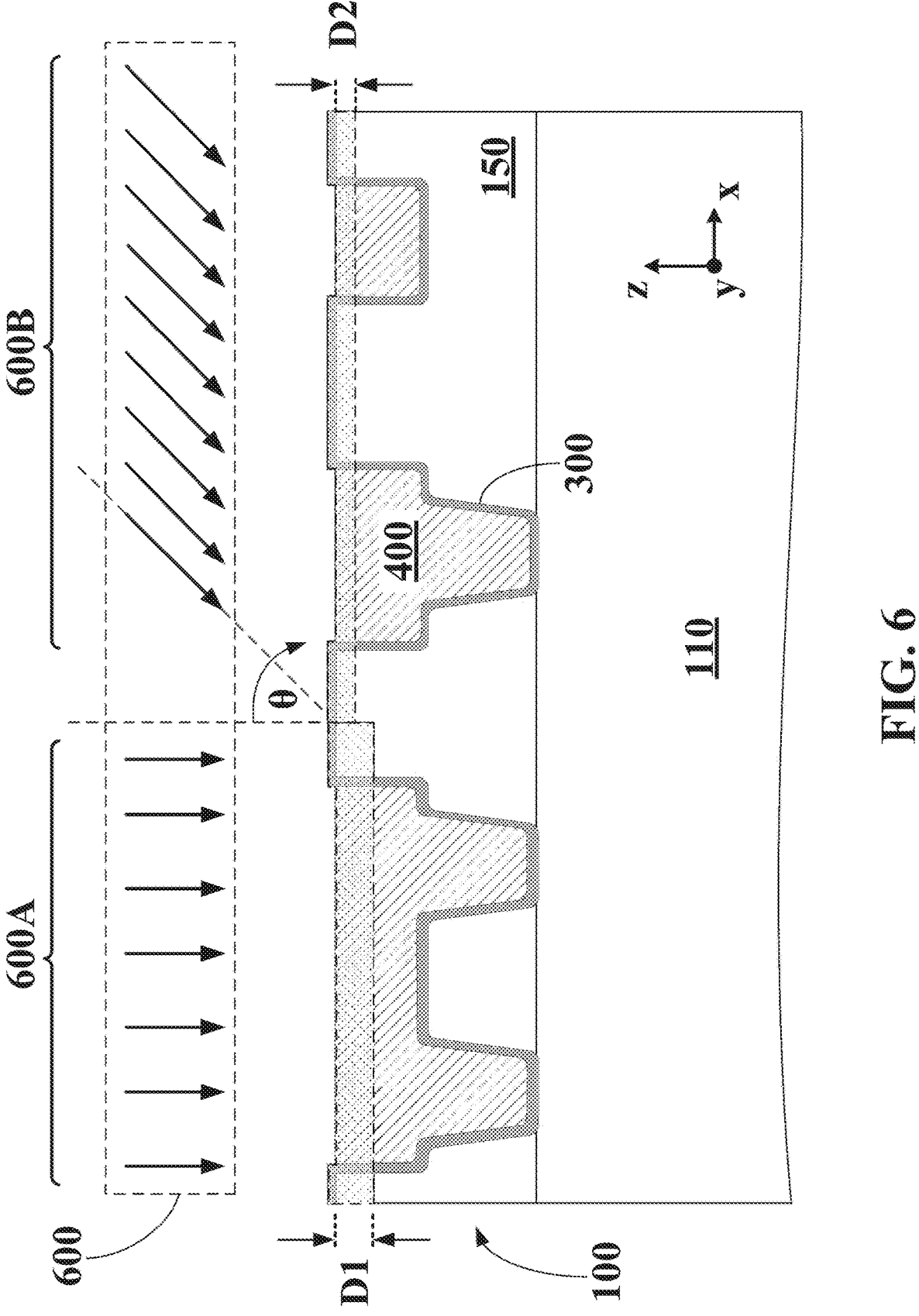
Figure 7:
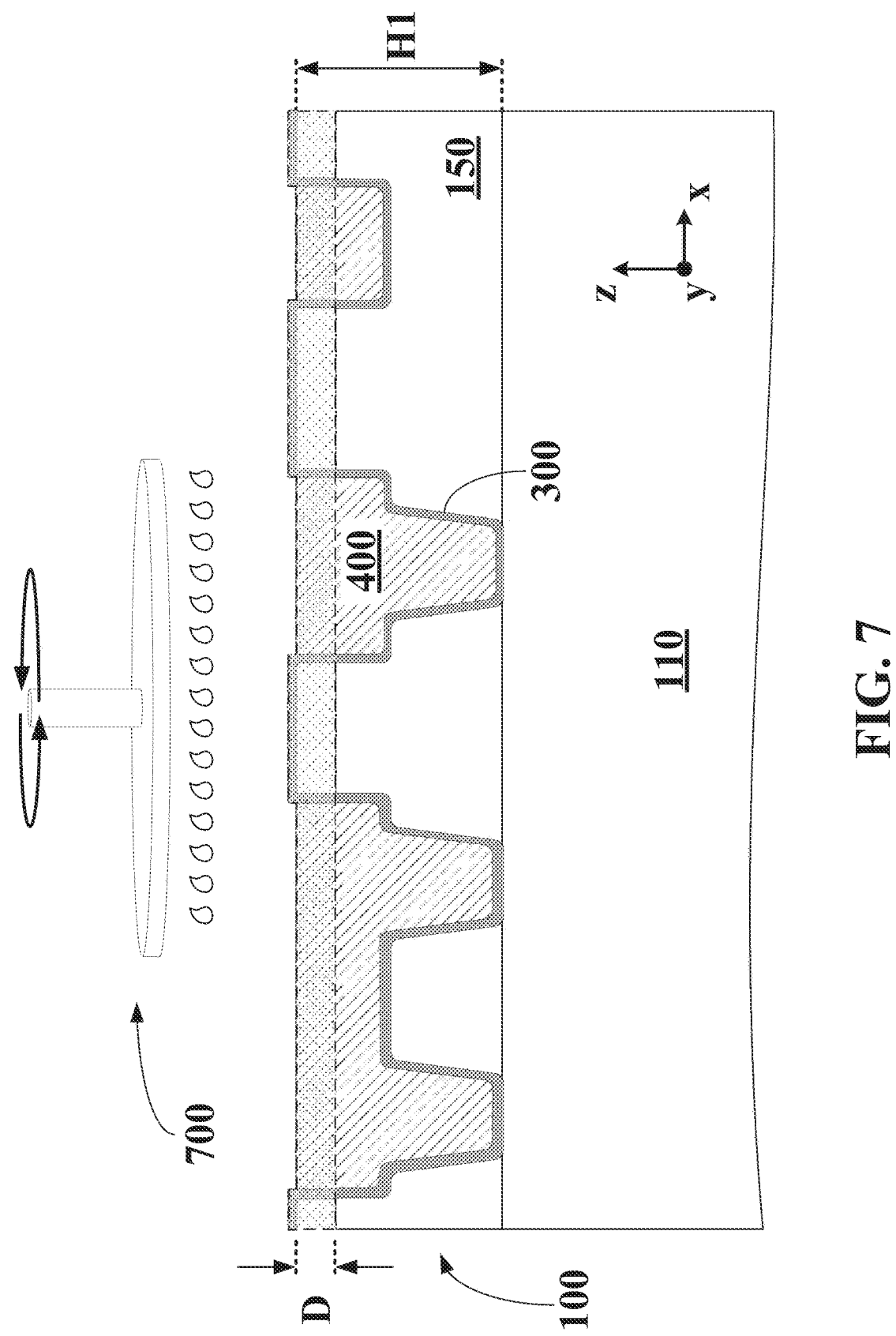

During the implant process of operation 240, ionized dopants 600 are accelerated towards substrate 110 and impinge the top surfaces of interconnect layer 100 at an incident angle θ as shown in FIG. 6. In some embodiments, incident angle θ, which is measured from a direction normal to substrate 110 (e.g., from the z-direction), ranges from about 0° to about 80°. For example, ionized dopants 600A in FIG. 6 impinge the top surface of interconnect layer 100 at a normal angle (e.g., at an incident angle θ equal to 0°) and ionized dopants 600B impinge the top surface of interconnect layer 100 at an incident angle of about 45°. In some embodiments, small incident angles (e.g., closer to 0°) allow ionized dopants 600 to penetrate deeper into low-k dielectric 150 as compared, for example, to ionized dopants impinging the top surface of interconnect layer at large incident angles closer to 80°). For example, implant depth D1 for ionized dopants 600A can be greater than implant depth D2 for ionized dopants 600B shown in FIG. 6 (e.g., D1>D2) under identical implant conditions with respect to dopant species and dopant energy. In some embodiments, incident angle θ is fixed for the duration of the implant process in operation 240.

In some embodiments, the implant depth within low-k dielectric 150 can be larger than that in ruthenium metal liner 300 and copper metal 410. This is because low-k dielectric 150 has a lower density compared to ruthenium metal liner 300 and copper metal 410. For example, low-k 150 can be porous. Further, the implant process of operation 240 may damage low-k dielectric 150. In some embodiments, parameters of the implant process, like incident angle θ, can be used to control the implant depth and mitigate the damage induced to low-k dielectric 150 by the dopants. For example, a grazing incident angle θ (e.g., closer to about 80°) can be used to reduce the implant depth in low-k dielectrics that are susceptible to damage during the implant process of operation 240.

In addition to incident angle θ, the implant depth can be controlled through the implant energy of ionized dopants 600, which can range from about 0.3 keV to about 50 keV. In some embodiments, for a fixed incident angle θ and identical dopant species, high implant energies (e.g., closer to about 50 keV) can result in a larger implant depth compared to low implant energies (e.g., closer to about 30 KeV). In some embodiments, the implant depth can be adjusted by incident angle θ, the implant energy of the ionized dopants, or a combination thereof to mitigate the implant damage to low-k dielectric 150. This ensures that ruthenium metal liner 300 is removed during the ruthenium CMP process without compromising the underlying low-k dielectric 150.

In some embodiments, non-polished portions of ruthenium metal liner 300, copper metal 400, and low-k dielectric 150 may include a residual dopant concentration equal to or greater than about $1\times10^{12}$ atoms/cm³. For example, a dopant concentration of about $1\times10^{12}$ atoms/cm³ or greater may be detected with secondary ion mass spectroscopy (SIMS) in low-k dielectric 150 after the ruthenium CMP process. In some embodiments, the shaded top portion of ruthenium interconnect layer 100 shown in FIG. 6 represents an exemplary doped region formed by the implant process of operation 240. In some embodiments, the doped region has a tail distribution towards its bottom surface, which can be detected in the non-polished portions as discussed above. In other words, the bottom surface of the doped region shown in FIG. 6 may not be sharp but includes a tail with a residual dopant concentration equal to or greater than about $1\times10^{12}$ atoms/cm³.

In some embodiments, the implant process of operation 240 further includes a dopant dose between about $1\times10^{14}$ dopants/cm² and about $1\times10^{17}$ dopants/cm². In some embodiments, ionized dopants 600 include, but are not limited to, C, B, P, O, Si, Ar, Ge, As, Xe, or any suitable dopant. In some embodiments, some dopant species may not be detectable with SIMS. For example, SIMS may be unable to determine the concentration of O, Xe, or Ar in low-k dielectric 150. According to some embodiments, the ionized dopants induce defects in ruthenium metal liner 300, which accelerate the oxidation of ruthenium metal liner 300 when ruthenium metal liner 300 is exposed to a ruthenium CMP slurry. In some embodiments, doped ruthenium metal oxidizes at a higher rate than un-doped ruthenium metal. In some embodiments, the polishing rate achieved for a doped ruthenium metal liner is between about 1.1 and about 1.7 times higher than that of an un-doped ruthenium metal liner.

In some embodiments, the CMP polishing rate for the ruthenium metal liner is modulated through implant process parameters, such as the dopant species used (e.g., the atomic mass of the dopant species), the implant energy, the incident angle, and the dopant dose. The aforementioned implant process parameters can control the defects or the "damage" induced to ruthenium metal liner 300 by the dopants, and therefore the oxidation rate of ruthenium metal liner 300 during a subsequent CMP process.

In some embodiments, the process parameters for the implant process described in operation 240 are selected as follows. Initially, the dopant species are selected. Based on the atomic mass of the dopant species, the implant energy and incident angle θ are selected to achieve the desired implant depth. Considerations for the implant depth include, but are not limited to, the material of low-k dielectric 150 and its tolerance to implant damage and the thickness of ruthenium liner 300 to be polished. By way of example and not limitation, the implant energy and incident angle θ can be provided by an implant simulator software that uses the atomic mass of the dopant species and the implant depth as input parameters. Once the dopant species, the implant energy, and the incident angle θ are determined, the dopant dose is selected based on the desired amount of dopants to be implanted in ruthenium liner 300.

In some embodiments, heavier dopants (e.g., with a higher atomic mass, like Xe and As) require a lower dopant dose compared to lighter dopants (e.g., with a lower atomic mass, like C and Ar) to achieve comparable ruthenium polishing rates. In some embodiments, the implant depth achieved by heavier dopants can be different from the implant depth achieved by lighter dopants. In some embodiments, implant energies less than about 0.3 keV and dopant doses lower than about $1 \times 10^{14}$ dopants/cm$^2$ do not substantially increase the polishing rate of ruthenium liner 300. On the other hand, implant energies greater than about 50 keV and dopant doses higher than about $1 \times 10^{17}$ dopants/cm$^2$ can damage low-k dielectric 150.

Figure 8:
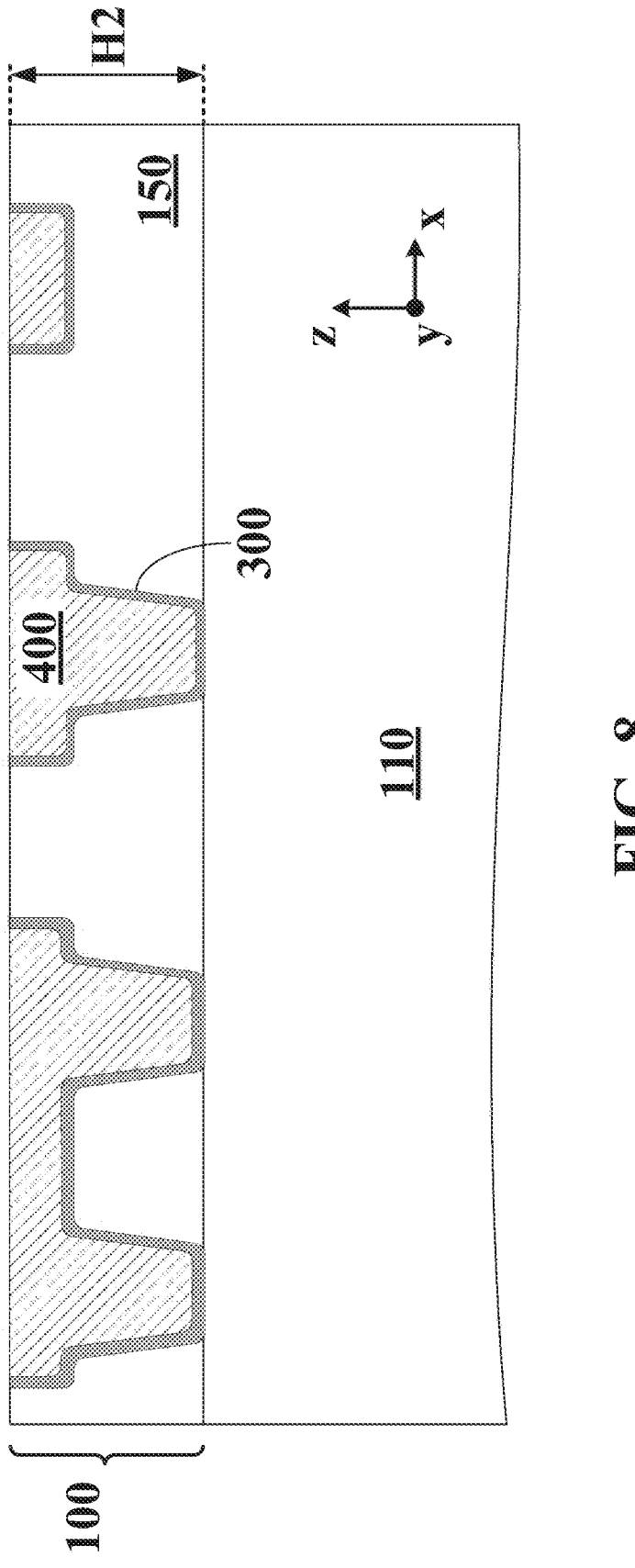

In referring to FIG. 2, method 200 continues with operation 250 and the process of polishing the doped ruthenium metal liner 300 with a ruthenium CMP process to form conductive structures in interconnect layer 100. In referring to FIG. 7, ruthenium CMP process 700 planarizes and removes doped ruthenium metal liner 300 within an implant depth D (e.g., the top shaded portion of interconnect layer 100). In some embodiments, ruthenium CMP process 700 removes copper metal 400 and low-k dielectric 150 at a substantially similar polishing rate with doped ruthenium metal liner 300 to achieve a planarized top surface topography for interconnect layer 100 as shown in FIG. 8. In some embodiments, and in referring to FIGS. 7 and 8, height H1 of interconnect layer 100 prior to ruthenium CMP process 700 is greater than height H2 of interconnect layer 100 after ruthenium CMP process 700 (e.g., H1>H2). By way of example and not limitation, the difference between heights H1 and H2 can be equal to, greater than, or less than implant depth D shown in FIG. 7.

According to some embodiments, after ruthenium CMP process 700, one or more interconnect layers (not shown in FIG. 8) are formed on interconnect layer 100. Method 200 can be repeated for any additional interconnect layer that includes a ruthenium metal liner and is formed on interconnect layer 100.

In some embodiments, the implant process of operation 240 in method 200 is not limited to BEOL interconnect layers with ruthenium metal liners like interconnect layer 100. For example, the implant process of operation 240 in method 200 can be used whenever planarization of ruthenium metal is required in the semiconductor fabrication process. In some embodiments, the implant process of operation 240 can be used to polish/planarize MEOL liner-free conductive structures filled with ruthenium metal, like line-free conductive structures 900 shown in FIG. 9.

Figure 9:
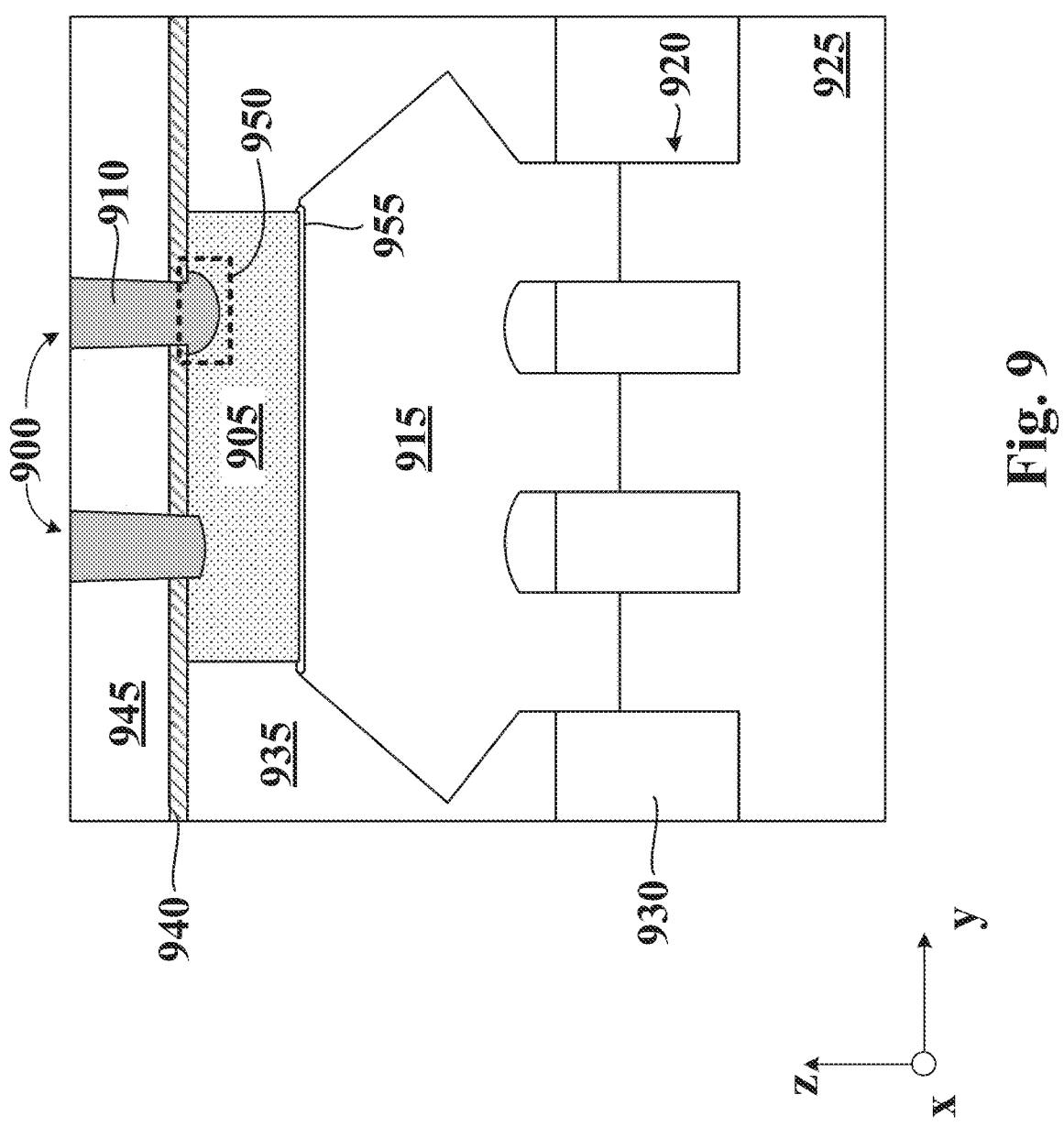
FIG. 9 is a cross-sectional view of a structure with conductive structures thereon, in accordance with some embodiments.

According to some embodiments, FIG. 9 is a cross-sectional view of a structure with conductive structures 900 formed on a cobalt conductive structure 905. In some embodiments, conductive structures 900 are filled with ruthenium metal 910. In some embodiments, conductive structures 900 are liner-free or barrier-free conductive structures filled with ruthenium metal 910. As shown in FIG. 9, cobalt conductive structure 905 is formed on a merged source/drain epitaxial structure 915 grown on fin structures 920 which are in turn disposed on a substrate 925. In some embodiments, fin structures 920 and bottom portions of source/drain epitaxial layer 915 are surrounded by a first dielectric layer 930, while upper portions of source/drain epitaxial layer 915 and cobalt conductive structure 905 are surrounded by a second dielectric layer 935. In some embodiments, first dielectric layer 930 forms an isolation structure, such a shallow trench isolation (STI).

The top and mid-sections of conductive structures 900 (e.g., above cobalt conductive structure 905) are surrounded by an etch stop layer 940 and an interlayer dielectric (ILD) 945. In contrast, bottom sections of conductive structures 900 (e.g., below the top surface of cobalt conductive structure 905) are embedded in cobalt conductive structure 905. The bottom sections of conductive structures 900 (e.g., within cobalt conductive structure 905) may or may not feature an "anchor" 950 that prevents ruthenium metal 910 from being "pulled-out" during the ruthenium planarization process (e.g., during the ruthenium CMP process). Anchor 950 also increases the surface area between ruthenium metal 910 and cobalt conductive structure 905 to reduce the contact resistance between the two structures. In some embodiments, a silicide layer 955 is interposed between cobalt conductive structure 905 and source/drain epitaxial structure 915 to reduce the electrical resistance between cobalt conductive structure 905 and source/drain epitaxial structure 915.

The structures shown in FIG. 9 are exemplary and variations are within the spirit and the scope of this disclosure. For example, each fin structure 920 can have its own source/drain epitaxial structure instead of a single merged source/drain epitaxial structure 915. Further, additional or fewer conductive structures 900 can be formed on cobalt conductive structure 905. Additional or fewer fin structures 920 can also be formed on substrate 925. Further, FIG. 9 shows selective portions of the structures and other portions are not shown for simplicity. For example, liner layers, barrier layers, or adhesion layers for cobalt structure 905 are not shown in FIG. 9. Further, a gate structure formed on fin structures 920 adjacent to source/drain epitaxial structure 915 along the x-direction, spacer structures, doped regions, and capping layers for source/drain epitaxial structure 915 and fin structures 920 are not shown.

In some embodiments, cobalt structure 905 is a source/drain contact on which conductive structures 900 are formed without intervening layers, such as barrier layers, liner layers, or adhesion layers. In some embodiments, conductive structures 900 form a network of vertical contacts that electrically connect cobalt structure 905 to upper interconnect layers, such as interconnect layer 100 shown in FIG. 8. According to some embodiments, conductive structures 900 are polished using similar processes used in operations 240 and 250 of method 200 shown in FIG. 2.

Figure 10:
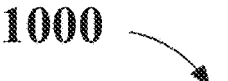
FIG. 10 is a flowchart of a method describing various operations for the formation of conductive structures, in accordance with some embodiments.

FIG. 10 is a flowchart of a method 1000, which describes operations for the formation of conductive structures 900 in ILD 945 shown in FIG. 9. More specifically, method 1000, like method 200 shown in FIG. 2, includes an implant process configured to increase the polishing rate of ruthenium metal 910 deposited during the formation of conductive structures 900. Other fabrication operations can be performed between the various operations of method 1000 and are omitted merely for clarity and ease of description. These various operations are within the spirit and the scope of this disclosure. Additionally, not all operations may be required to perform the disclosure provided herein. Some of the operations may be performed concurrently, or in a different order than the ones shown in FIG. 10. In some embodiments, one or more other operations may be performed in addition to or in place of the presently described operations. Method 1000 will be described in reference to FIGS. 11-15.

Figure 11:
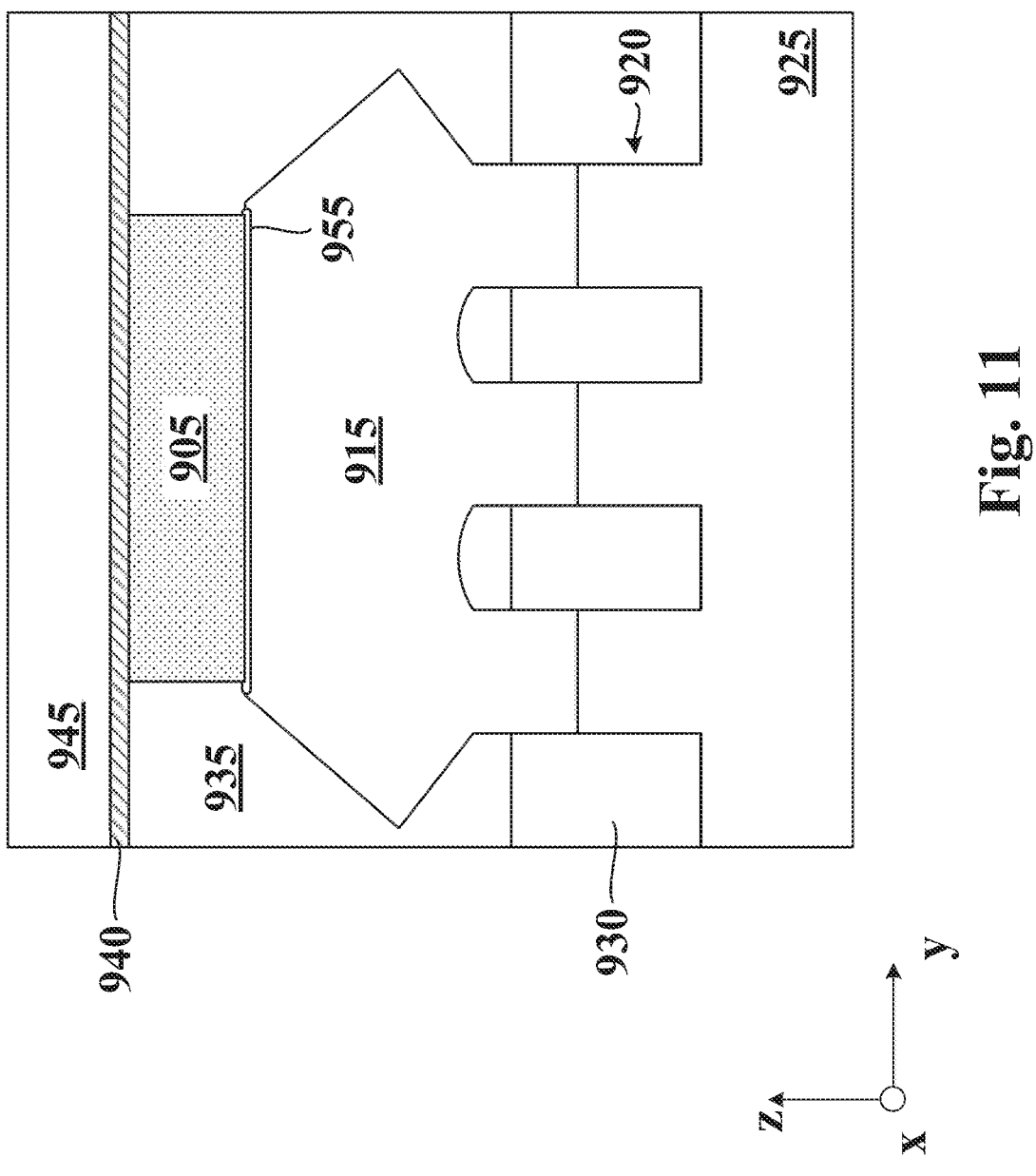
FIGS. 11-15 are cross-sectional views of intermediate structures during the formation of conductive structures, in accordance with some embodiments.
Figure 12:
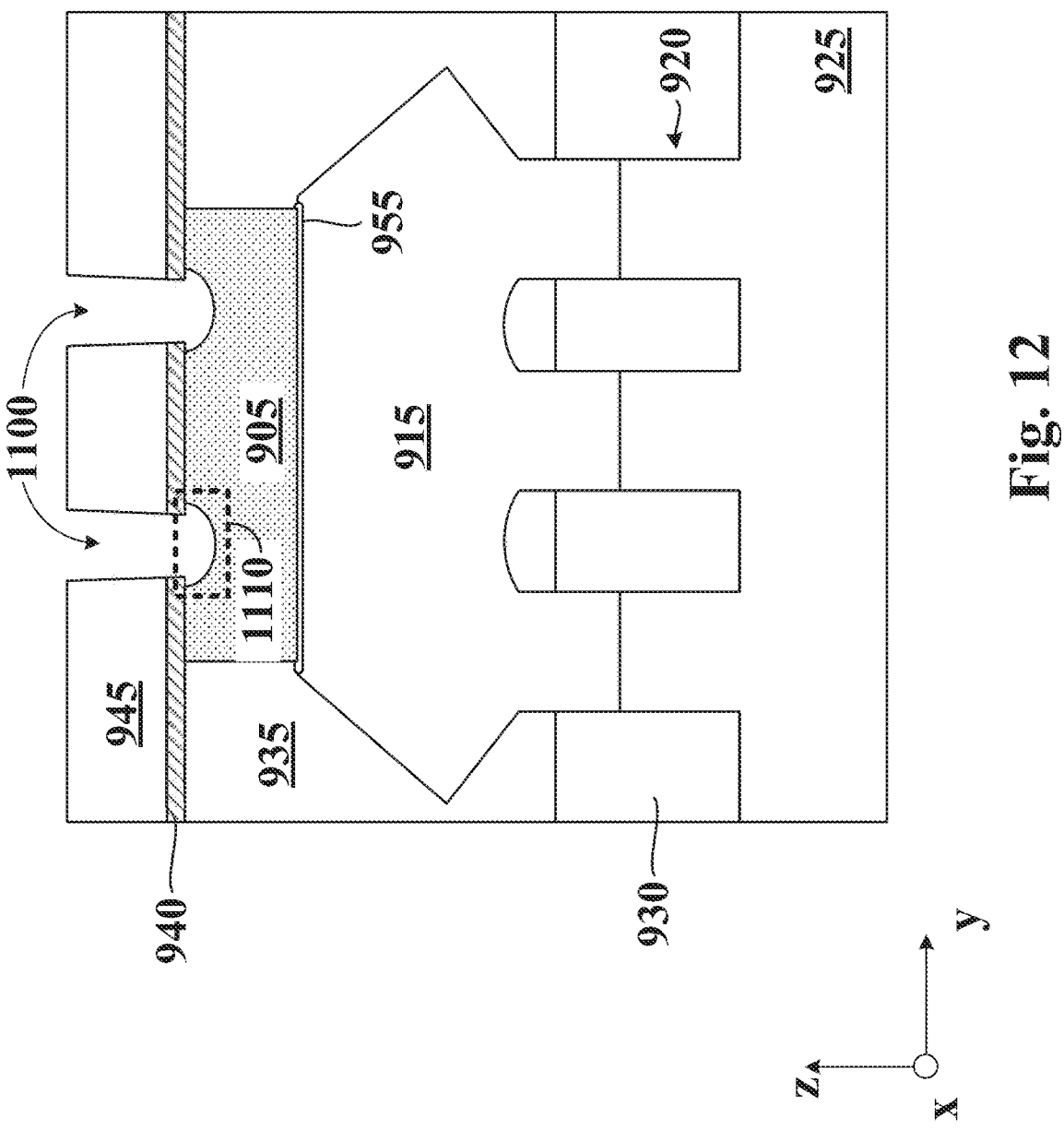

In some embodiments, FIG. 11 is the structure shown in FIG. 9 prior to the formation of conductive structures 900 and FIG. 12 is the structure shown in FIG. 11 after the formation of contact openings 1100 in ILD 945 but prior to the deposition of ruthenium metal 910. By way of example and not limitation, contact openings 1100 in ILD 945 can be formed with sequential photolithography and etching operations. In some embodiments, FIG. 12 is a precursor structure (e.g., a starting structure) for method 1000 shown in FIG. 10.

In the example of FIG. 12, contact openings 1100 are formed with an "anchor recess" 1110. However, this is not limiting and contact openings 1100 can be formed without anchor recess 1110. In some embodiments, selective contact openings 1100 are formed with an anchor recess 1110.

In referring to FIG. 10, method 1000 begins with operation 1010 and the process of depositing ruthenium metal (e.g., ruthenium metal 910) in contact openings (e.g., contact openings 1100) formed in a dielectric layer (e.g., ILD 945). By way of example and not limitation, ruthenium metal 910 can be deposited with similar methods used for the deposition of ruthenium metal liner layer 300. For example, ruthenium metal 910 can be deposited with a CVD process, an ALD process or with another appropriate method at a temperature below about 200° C. (e.g., about 180° C.) using a ruthenium carbonyl precursor chemistry, such as $Ru_3(CO)_{12}$. In some embodiments, the ruthenium metal is deposited at a thickness of about 20 nm or at a thickness sufficient to substantially fill openings 1100, including anchor recess 1110.

Figure 13:
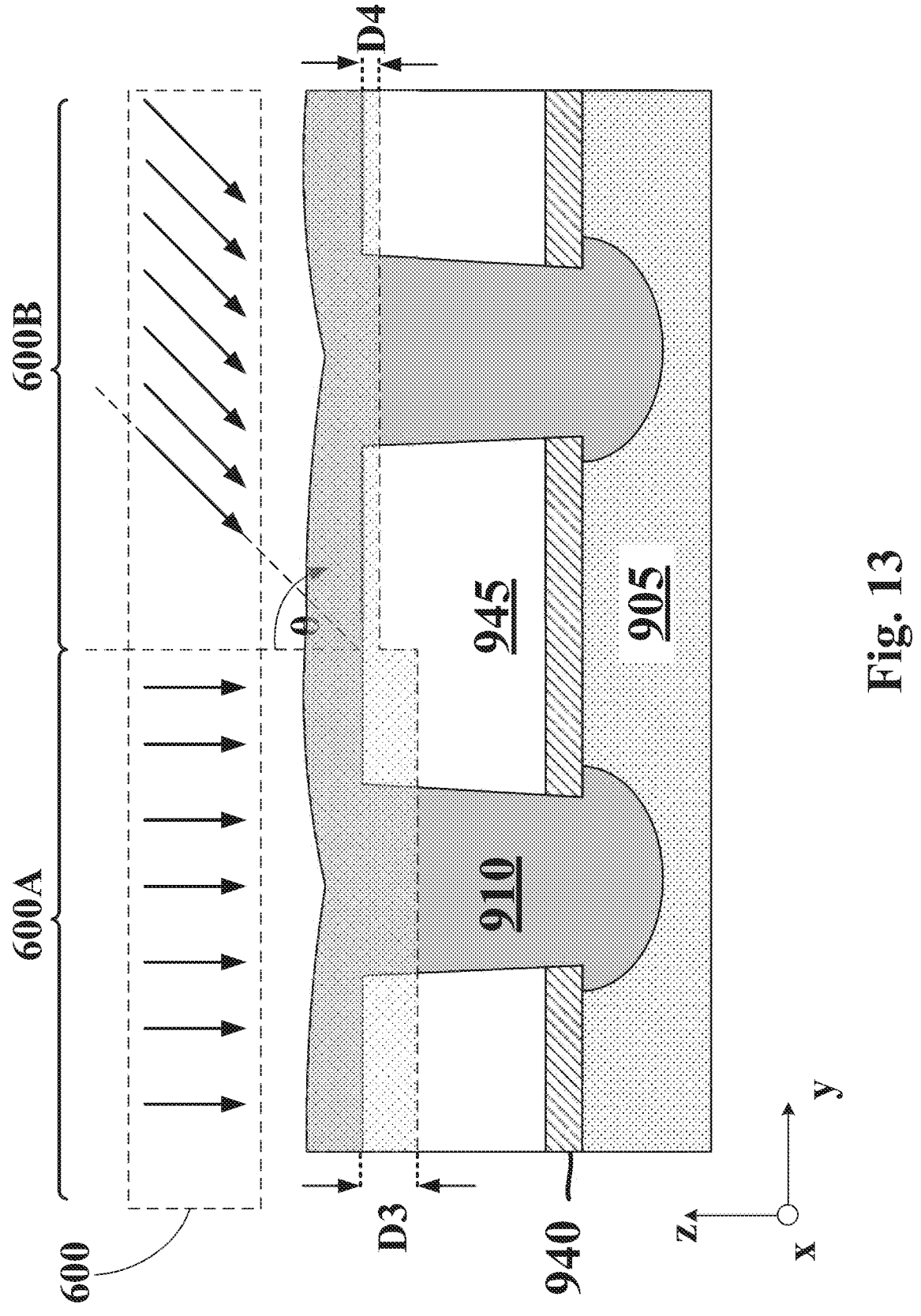
Figure 14:
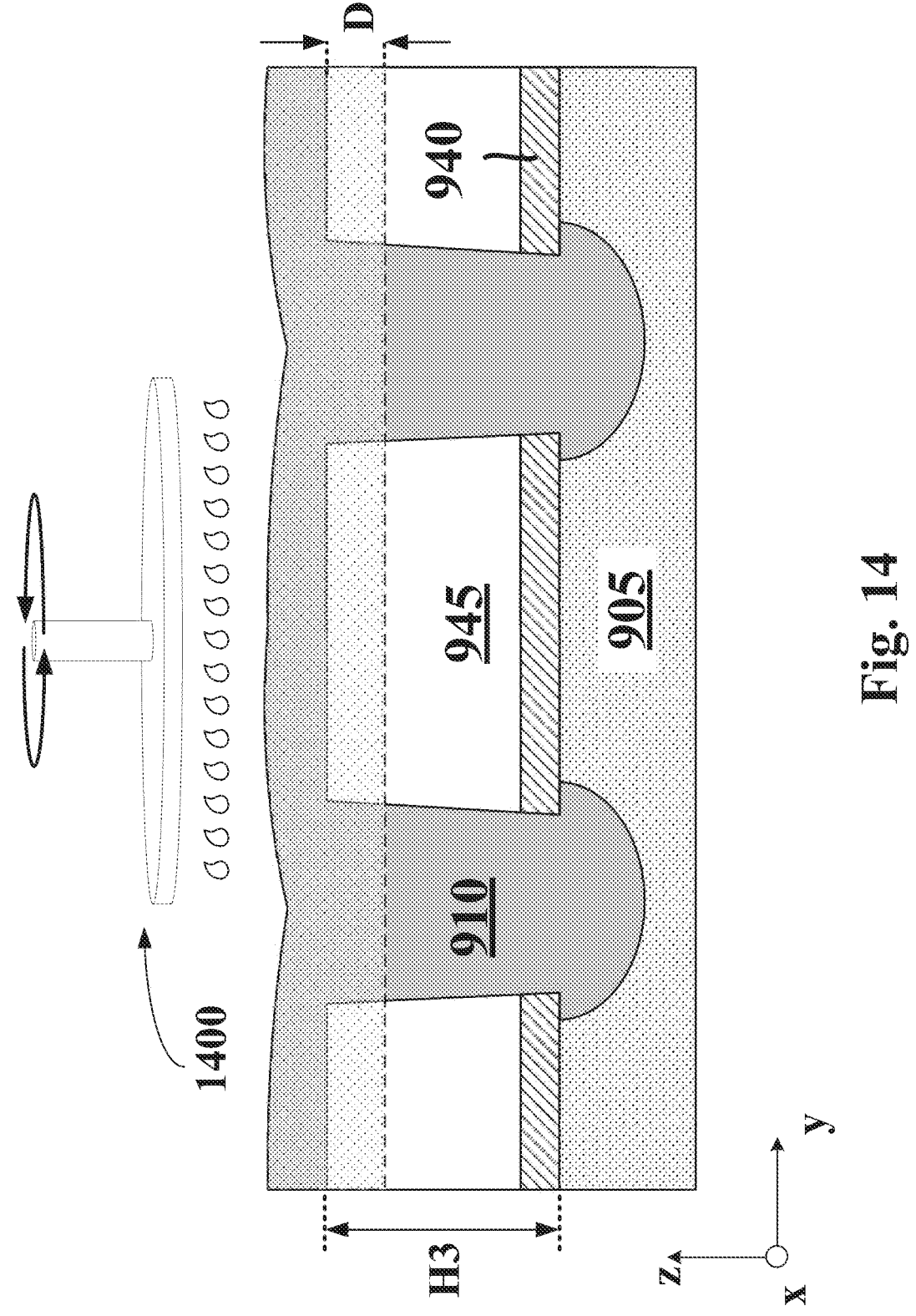

In some embodiments, FIG. 13 is a magnified view of contact openings 1100 shown in FIG. 12 after the deposition of ruthenium metal 910 according to operation 1010. In some embodiments, ruthenium metal 910 fills the contact openings in ILD 945 and forms an overburden over top surfaces of ILD 945 as shown in FIG. 13. The overburden will be removed by a ruthenium CMP process so that liner-free contacts 900 are formed. As discussed above, ruthenium metal 910 is deposited directly on cobalt structure 905 without the presence of intervening layers. Further, ruthenium metal 910 is in direct contact with sidewall surfaces of etch stop layer 940 and ILD 945, which collectively form the sidewalls surfaces of opening 600 shown in FIG. 12.

In referring to FIG. 10, method 1000 continues with operation 1020 and the process of doping ruthenium metal 910 with an implant process. According to some embodiments, operation 1020 of method 1000 is similar to operation 240 of method 200 shown in FIG. 2. For example, the implant process of operation 1020 and the implant process of operation 240 share common operating principles. For example, during the implant process of operation 1020, ionized dopants 600 are accelerated towards substrate 925 (e.g., shown in FIG. 12) and impinge top surfaces of ruthenium metal 910 and ILD 945 at an incident angle θ shown in FIG. 13. In some embodiments, incident angle θ is measured from a direction normal to the planar top surface of ILD 945 (e.g., from the z-direction). In some embodiments, incident angle θ ranges from about 0° to about 80°. For example, ionized dopants 600A in FIG. 13 impinge the top surface of ILD 945 at a normal angle (e.g., an incident angle θ equal to 0°) and ionized dopants 600B impinge the top surface of ILD 945 at an incident angle of about 45°. In some embodiments, small incident angles (e.g., closer to 0°) allow ionized dopants 600 to penetrate deeper into ruthenium metal 910 and ILD 945 as compared to ionized dopants with large incident angles (e.g., closer to 80°). For example, implant depth D3 of ionized dopants 600A is greater than implant depth D4 of ionized dopants 600B (e.g., D3>D4) under similar implant conditions implant energy and dopant species). In some embodiments, incident angle θ is fixed for the duration of the implant process in operation 1020.

Similar to the implant process discussed above with respect to operation 240, in the implant process of operation 1020, the implant depth can be controlled through the energy of ionized dopants 600. In some embodiments, the implant energy of the ionized dopants ranges between about 0.3 keV and 50 keV. In some embodiments, for a fixed incident angle θ and for the same type of dopants, high implant energies (e.g., about 50 keV) can result in a larger implant depth compared to low implant energies (e.g., about 30 keV). In some embodiments, the implant depth is adjusted by incident angle θ, the implant energy of the ionized dopants, or a combination thereof.

In some embodiments, non-polished portions of ruthenium metal 910 and ILD 945 may include a residual dopant concentration equal to or greater than about $1\times10^{12}$ atoms/$cm^3$. For example, a dopant concentration of about $1\times10^{12}$ atoms/$cm^3$ or greater may be detected with SIMS in ILD 945. In some embodiments, the shaded top portion of ruthenium metal 910 and ILD 945 shown in FIG. 13 represents an exemplary doped region within ruthenium metal 910 and ILD 945 achieved by the implant process of operation 1020.

In some embodiments, the implant process of operation 1020 further includes a dopant dose between about $1\times10^{14}$ dopants/$cm^2$ and about $1\times10^{17}$ dopants/$cm^2$. In some embodiments, ionized dopants 600 include, but are not limited to, C, B, P, O, Si, Ar, Ge, As, or Xe. According to some embodiments, the ionized dopants induce defects in ruthenium metal 910 that accelerate the oxidation of ruthenium metal 910 when the latter is exposed to a ruthenium CMP slurry. In some embodiments, doped ruthenium metal has a higher polishing rate compared to un-doped ruthenium metal when both are polished under similar CMP processing conditions. In some embodiments, the polishing rate of doped ruthenium metal is between about 1.1 and about 1.7 times higher than that of un-doped ruthenium metal.

As discussed above with respect to the implant process of operation 240, the CMP polishing rate for the ruthenium metal can be modulated through a combination of implant process parameters, such as the type of dopant species (e.g., the atomic mass of the dopant species), the implant energy, the incident angle, and the dopant dose. The aforementioned implant process parameters control the defects or the "damage" induced to ruthenium metal 910 by the dopants, and therefore the oxidation rate of ruthenium metal 910 during a subsequent CMP process.

The process parameters for the implant process described in operation 1020 can be selected as described in operation 240. For example, the dopant species can be selected first, followed by the implant energy and incident angle, followed by the implant dose.

In some embodiments, heavier dopants require a lower dopant dose than lighter dopants to achieve comparable ruthenium polishing rates. In some embodiments, the implant depth achieved by heavier dopants is different from the implant depth achieved by lighter dopants. In some embodiments, implant energies less than about 0.3 keV and dopant doses lower than about $1\times10^{14}$ dopants/$cm^2$ do not substantially increase the polishing rate of ruthenium liner 300. On the other hand, implant energies greater than about 50 keV and dopant doses higher than about $1\times10^{17}$ dopants/$cm^2$ can damage ILD 945.

Figure 15:
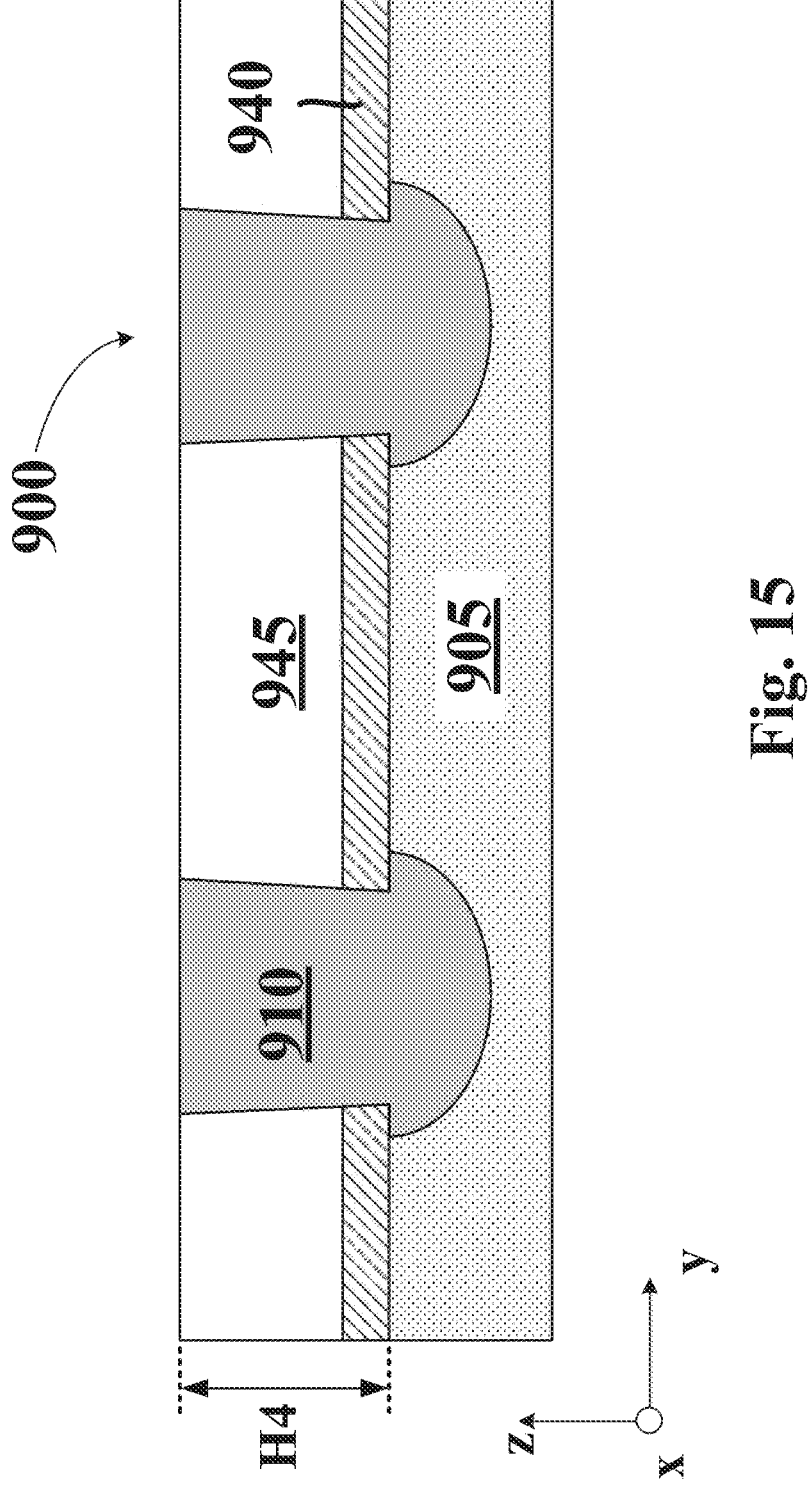

In referring to FIG. 10, method 1000 continues with operation 1030 and the process of polishing the doped ruthenium metal 910 with a ruthenium CMP process to form conductive structures (e.g., conductive structures 900). In referring to FIG. 14, ruthenium CMP process 1400 planarizes and removes doped ruthenium metal within an implant depth D and the ruthenium metal overburden over ILD 945. In some embodiments, ruthenium CMP process 1400 removes the ruthenium metal and ILD 945 at a substantially similar polishing rate to achieve a planarized top surface topography as shown in FIG. 15. In some embodiments, and in referring to FIG. 14, height H3 of ILD 945 prior to ruthenium CMP process 1400 is larger than height H4 of ILD 945 after ruthenium CMP process 1400 (e.g., H3>H4). By way of example and not limitation, the difference between H3 and H4 is substantially equal to implant depth D shown in FIG. 14.

In some embodiments, ruthenium CMP process 1400 is different from the ruthenium CMP process 250 due to the differences between the polished materials.

According to some embodiments, after ruthenium CMP process 1400, one or more interconnect layers (e.g., like interconnect layer 100 shown in FIG. 8) can be formed on conductive structures 900 and ILD 945.

Various embodiments in accordance with this disclosure are directed to a method for the planarization of ruthenium metal layers in MEOL and BEOL conductive structures. In some embodiments, the ruthenium metal is implanted (doped) with dopant species to increase its polishing rate during a subsequent ruthenium CMP process. In some embodiments, the implant process includes implants with an implant energy between about 0.3 keV and about 50 keV and an incident angle between 0° and about 80°. In some embodiments, the implant dose ranges between about $1\times10^{14}$ dopants/cm$^2$ and about $1\times10^{17}$ dopants/cm$^2$ and includes dopants selected from C, B, P, O, Si, Ar, Ge, As, or Xe. In some embodiments, the doped ruthenium layers are removed during a subsequent CMP process. In some embodiments, a residual dopant concentration of about $1\times10^{13}$ atoms/cm$^3$ or greater may be detected with SIMS in the surrounding dielectric material after the ruthenium CMP process. In some embodiments, doped ruthenium metal layers oxidize faster than un-doped ruthenium metal layers during a ruthenium CMP process. In some embodiments, doped ruthenium metal layers have a polishing rate that is between about 1.1 and about 1.7 times the polishing rate of un-doped ruthenium metal layers.

In some embodiments, a method includes forming a first interconnect layer on a substrate, where forming the first interconnect layer includes forming openings in a dielectric layer disposed on the substrate, depositing a ruthenium metal liner in the openings, and depositing copper metal on the ruthenium metal to fill the openings. Forming the first interconnect layer further includes polishing the copper metal, doping the ruthenium metal liner, and polishing the doped ruthenium metal liner to form conductive structures in the first interconnect layer. The method further includes forming a second interconnect layer on the first interconnect layer.

In some embodiments, a method includes forming a first conductive structure on a second conductive structure, where forming the first conductive structure includes forming openings in a dielectric layer disposed on the second conductive structure and depositing a ruthenium metal in the openings to overfill the openings. Forming the first conductive structure further includes doping the ruthenium metal and polishing the doped ruthenium metal to form the first conductive structure. The method also includes forming an interconnect layer on the first conductive structure.

In some embodiments, an interconnect layer includes a dielectric layer on a substrate, conductive structures in the dielectric layer, where the conductive structures include a first conductive material and a ruthenium liner surrounding sidewall and bottom surfacers of the first conductive material. Further, the dielectric layer includes dopants having a dopant concentration of at least about $1\times10^{13}$ atoms/cm$^3$.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:

forming an opening in a dielectric layer disposed on a substrate;

forming a ruthenium metal structure in the opening;

doping the ruthenium metal structure and the dielectric layer with a dopant via an implant process; and polishing the doped ruthenium metal structure and the doped dielectric layer.

2. The method of claim 1, wherein forming the ruthenium metal structure comprises depositing a ruthenium metal liner in the opening and on top surfaces of the dielectric layer outside the opening.

3. The method of claim 1, wherein forming the ruthenium metal structure comprises depositing a ruthenium metal in the opening to overfill the opening.

4. The method of claim 1, wherein polishing the doped ruthenium metal structure and the dielectric layer comprises removing the doped ruthenium metal structure and the dielectric layer at a substantially same polishing rate.

5. The method of claim 1, wherein doping the ruthenium metal structure and the dielectric layer comprises implanting a top portion of the ruthenium metal structure and a top portion of the dielectric layer with the dopant.

6. The method of claim 1, wherein doping the ruthenium metal structure and the dielectric layer comprises implanting the ruthenium metal structure and the dielectric layer with carbon (C), boron (B), phosphorous (P), oxygen (O), silicon (Si), argon (Ar), germanium (Ge), arsenic (As), or xenon (Xe).

7. The method of claim 1, wherein doping the ruthenium metal structure and the dielectric layer comprises implanting the ruthenium metal structure and the dielectric layer with an ion beam having an incident angle between about 0° and about 80°.

8. The method of claim 1, wherein doping the ruthenium metal structure and the dielectric layer comprises implanting the ruthenium metal structure and the dielectric layer with dopants having an ion energy between about 0.3 keV and about 20 keV.

9. A method, comprising:

forming an opening in a dielectric layer disposed on a substrate;

forming a ruthenium metal structure in the opening, wherein the ruthenium metal structure is in contact with the dielectric layer;

doping a portion of the ruthenium metal structure and a portion of the dielectric layer with a dopant via an implant process; and removing the doped portion of the ruthenium metal structure and the doped portion of the dielectric layer.

10. The method of claim 9, wherein forming the ruthenium metal structure comprises depositing a ruthenium metal liner in the opening and on top surfaces of the dielectric layer outside the opening.

11. The method of claim 9, wherein forming the ruthenium metal structure comprises filling the opening with a ruthenium metal and forming an overburden with the ruthenium metal on surfaces of the dielectric layer outside the opening.

12. The method of claim 9, wherein removing the doped portion of the ruthenium metal structure and the doped portion of the dielectric layer comprises polishing the dielectric layer and the doped ruthenium metal structure at a substantially same polishing rate.

13. The method of claim 9, wherein doping the portion of the ruthenium metal structure comprises implanting a top portion of the ruthenium metal structure with carbon (C), boron (B), phosphorous (P), oxygen (O), silicon (Si), argon (Ar), germanium (Ge), arsenic (As), or xenon (Xe).

14. The method of claim 9, wherein doping the portion of the ruthenium metal structure comprises implanting a top portion of the ruthenium metal structure to form a top doped portion and a bottom non-doped portion.

15. The method of claim 9, wherein doping the portion of the ruthenium metal structure comprises increasing a polishing rate of the doped portion of the ruthenium metal structure by about 1.1 to about 1.7 times.

16. A method, comprising:

forming a plurality of openings extending through a dielectric layer;

forming a ruthenium metal structure in the plurality of openings and on the dielectric layer;

doping the ruthenium metal structure and the dielectric layer with a dopant via an implant process; and removing a portion of the doped ruthenium metal structure and a portion of the doped dielectric layer.

17. The method of claim 16, wherein removing the portion of the doped ruthenium metal structure and the portion of the doped dielectric layer comprises polishing the doped dielectric layer and the doped ruthenium metal structure at a substantially same polishing rate.

18. The method of claim 16, wherein doping the ruthenium metal structure and the dielectric layer comprises implanting a top portion of the ruthenium metal structure and the dielectric layer with carbon (C), boron (B), phosphorous (P), oxygen (O), silicon (Si), argon (Ar), germanium (Ge), arsenic (As), or xenon (Xe).

19. The method of claim 16, wherein doping the ruthenium metal structure comprises implanting a top portion of the ruthenium metal structure to form a top doped portion and a bottom non-doped portion.

20. The method of claim 16, wherein doping the ruthenium metal structure comprises increasing a polishing rate of the doped ruthenium metal structure by about 1.1 to about 1.7 times.

* * * * *